(12) United States Patent
Sakuma et al.

(10) Patent No.: US 12,289,936 B2
(45) Date of Patent: Apr. 29, 2025

(54) LIGHT-EMITTING ELEMENT, LIGHT-EMITTING DEVICE

(71) Applicant: SHARP KABUSHIKI KAISHA, Osaka (JP)

(72) Inventors: Jun Sakuma, Osaka (JP); Yasushi Asaoka, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 487 days.

(21) Appl. No.: 17/760,556

(22) PCT Filed: Sep. 30, 2019

(86) PCT No.: PCT/JP2019/038622
§ 371 (c)(1),
(2) Date: Mar. 15, 2022

(87) PCT Pub. No.: WO2021/064822
PCT Pub. Date: Apr. 8, 2021

(65) Prior Publication Data
US 2022/0344550 A1 Oct. 27, 2022

(51) Int. Cl.
*H10H 20/851* (2025.01)
*H10H 29/14* (2025.01)

(52) U.S. Cl.
CPC .... *H10H 20/8514* (2025.01); *H10H 20/8512* (2025.01); *H10H 29/142* (2025.01)

(58) Field of Classification Search
CPC ...... H10K 50/13; H10K 50/115; H10K 50/11; H10K 50/125; H10K 59/10; H10K 71/00; H10K 50/166; H10K 50/16; H10K 50/82; H10K 50/81; H10K 50/171; H10K 59/1213; H10K 50/15; H10K 2102/351; H10K 2101/40; H10K 2102/331; H05B 33/14; H01L 27/156; H01L 33/505; H01L 33/502; H01L 31/035218; H01L 33/06; H01L 31/0304; H01L 31/0296; H01L 31/028; C01B 19/007; C09K 11/883; C09K 11/565; B82Y 20/00; B82Y 30/00; C08K 3/22; C08K 3/36; C08K 2003/2296;
(Continued)

(56) References Cited

U.S. PATENT DOCUMENTS 9,595,625 B2 * 3/2017 Murayama ............ C01B 19/007
2007/0103068 A1 5/2007 Bawendi et al.
(Continued)

FOREIGN PATENT DOCUMENTS

JP 2012023388 A 2/2012
WO 2011/148791 A1 12/2011
WO 2013/157494 A1 10/2013

*Primary Examiner* — Mouloucoulaye Inoussa
(74) *Attorney, Agent, or Firm* — ScienBiziP, P.C.

(57) ABSTRACT

A light-emitting element includes a first light-emitting layer including a first quantum dot and a second light-emitting layer including a second quantum dot provided between the cathode electrode and an anode electrode in order from the cathode electrode, the first quantum dot has a core-shell structure including a first core and a first shell, the second quantum dot has a core-shell structure including a second core and a second shell, and an energy level at a lower end of a conduction band of the first core is higher than an energy level at a lower end of a conduction band of the second core.

20 Claims, 11 Drawing Sheets

(58) Field of Classification Search
CPC .... C08K 2003/2217; C08K 2003/2231; C08L 29/04; C08L 2207/53; C01P 2004/64; C01P 2004/04; C01P 2004/80; C09D 129/04
See application file for complete search history.

(56) References Cited

U.S. PATENT DOCUMENTS

| | | | |
|---|---|---|---|
| 2008/0206565 A1* | 8/2008 | Takahashi | B82Y 30/00 |
| | | | 106/31.13 |
| 2010/0213437 A1* | 8/2010 | Akai | C09K 11/883 |
| | | | 977/774 |
| 2010/0213438 A1* | 8/2010 | Cho | H10K 50/156 |
| | | | 438/47 |
| 2012/0175593 A1* | 7/2012 | Murayama | H01L 31/035218 |
| | | | 257/E29.071 |
| 2012/0238047 A1 | 9/2012 | Bawendi et al. | |
| 2012/0292595 A1 | 11/2012 | Bawendi et al. | |
| 2013/0069036 A1 | 3/2013 | Miyata | |
| 2015/0076469 A1 | 3/2015 | Ikemizu et al. | |
| 2016/0200974 A1* | 7/2016 | Smith | C30B 7/005 |
| | | | 117/64 |
| 2016/0225947 A1* | 8/2016 | Murayama | C01B 19/007 |
| 2016/0233449 A1* | 8/2016 | Murayama | C09K 11/565 |
| 2017/0125635 A1 | 5/2017 | Bawendi et al. | |
| 2017/0185985 A1* | 6/2017 | Harada | G06F 18/28 |
| 2018/0190924 A1* | 7/2018 | Tsang | H10K 50/82 |
| 2018/0271609 A1* | 9/2018 | Sun | A61L 31/04 |
| 2019/0081112 A1* | 3/2019 | Tsukamoto | H10K 50/125 |
| 2019/0081262 A1* | 3/2019 | Kim | C08K 3/22 |
| 2019/0115398 A1* | 4/2019 | Tsukamoto | H10K 50/15 |
| 2019/0157595 A1* | 5/2019 | Seo | H10K 50/15 |
| 2019/0214566 A1* | 7/2019 | Takahiro | C09K 11/02 |
| 2019/0280230 A1* | 9/2019 | Seo | H10K 71/00 |
| 2019/0280232 A1* | 9/2019 | Chang | H10K 71/12 |
| 2019/0280235 A1* | 9/2019 | Kim | H10K 85/654 |
| 2019/0326539 A1* | 10/2019 | Chung | H10K 59/12 |
| 2020/0017765 A1* | 1/2020 | Kim | H10K 59/38 |
| 2020/0266375 A1* | 8/2020 | Li | H10K 50/11 |
| 2020/0388763 A1* | 12/2020 | Kato | H10K 85/151 |
| 2021/0013377 A1* | 1/2021 | Kim | C09K 11/883 |
| 2021/0102120 A1* | 4/2021 | Kim | G03F 7/0275 |
| 2021/0104696 A1* | 4/2021 | Park | H10K 85/115 |
| 2021/0126218 A1* | 4/2021 | Kim | H10K 50/166 |
| 2021/0226172 A1* | 7/2021 | Chung | C09K 11/06 |
| 2021/0257573 A1* | 8/2021 | Nam | C09K 11/883 |
| 2022/0020898 A1* | 1/2022 | Ueta | H01L 33/06 |
| 2022/0052284 A1* | 2/2022 | Kida | H10K 50/15 |
| 2022/0149249 A1* | 5/2022 | Kubo | H01L 33/005 |
| 2022/0158115 A1* | 5/2022 | Naka | H10K 50/17 |
| 2022/0173344 A1* | 6/2022 | Wang | H10K 50/11 |
| 2023/0413589 A1* | 12/2023 | Naka | H10K 50/115 |
| 2024/0081086 A1* | 3/2024 | Kida | C09K 11/00 |

* cited by examiner

LIGHT-EMITTING ELEMENT, LIGHT-EMITTING DEVICE

TECHNICAL FIELD

The disclosure relates to a light-emitting element provided with a light-emitting layer including quantum dots and a light-emitting device including the light-emitting element.

BACKGROUND ART

PTL 1 discloses a light-emitting device including a light-emitting element in which a semiconductor nanocrystal is provided in a light-emitting layer.

CITATION LIST

Patent Literature

PTL 1: JP 2012-23388 A (Feb. 2, 2012)

SUMMARY

Technical Problem

In the light-emitting element described in PTL 1 in which semiconductor nanoparticles, that is, quantum dots are provided in a light-emitting layer, in general, an excess of electrons tends to be generated in the light-emitting layer. When an excess of electrons is generated in the light-emitting layer, the carrier balance between electrons and holes in the light-emitting layer is lost, and electrons may flow out from the light-emitting layer toward an anode electrode, thereby reducing luminous efficiency.

Solution to Problem

In order to solve the problem described above, a light-emitting element according to an aspect of the disclosure includes: a cathode electrode; an anode electrode; and a first light-emitting layer including a first quantum dot and a second light-emitting layer including a second quantum dot provided between the cathode electrode and the anode electrode in order from the cathode electrode, wherein the first quantum dot has a core-shell structure including at least a first core and a first shell, the second quantum dot has a core-shell structure including at least a second core and a second shell, and a level at a lower end of a conduction band of the first core is higher than a level at a lower end of a conduction band of the second core.

In order to solve the problem described above, a light-emitting device according to an aspect of the disclosure includes the light-emitting element according to the aspect of the disclosure.

Advantageous Effects of Disclosure

According to an aspect of the disclosure, it is possible to provide a light-emitting element that suppresses an outflow of electrons from a light-emitting layer to an anode electrode and has an improved luminous efficiency, and a light-emitting device.

DESCRIPTION OF EMBODIMENTS

First Embodiment

Figure 1:
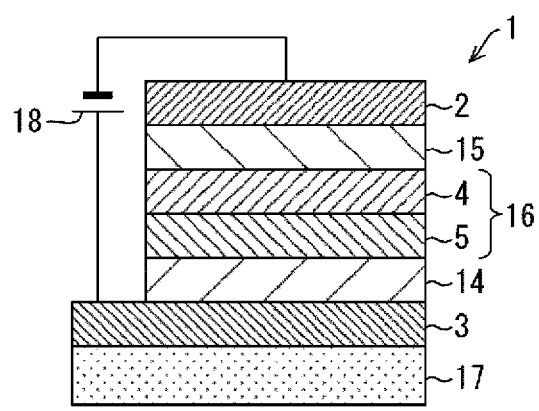
FIG. 1 is a cross-sectional view illustrating a light-emitting element according to a first embodiment.
Figure 2:
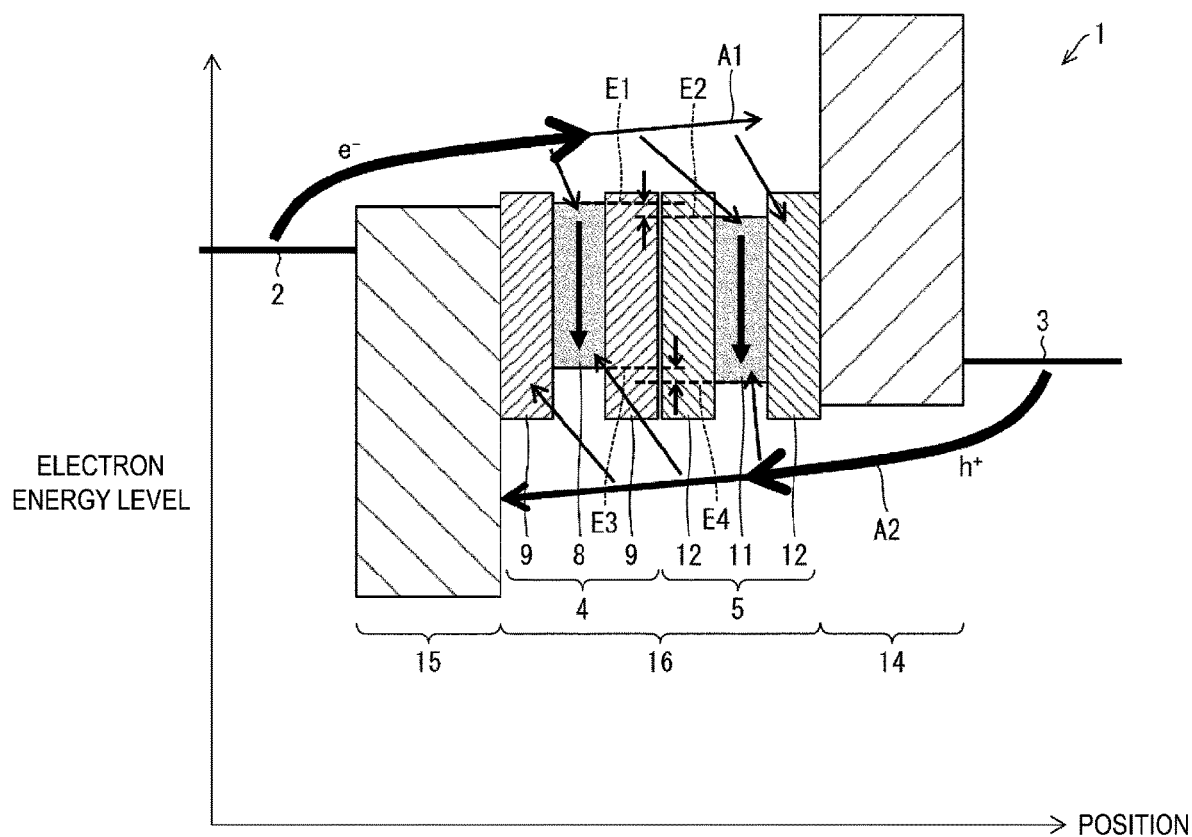
FIG. 2 is a graph for describing an energy level of the light-emitting element according to the first embodiment.

FIG. 1 is a cross-sectional view illustrating a light-emitting element 1 according to a first embodiment. FIG. 2 is a graph for describing an energy level of the light-emitting element 1. The horizontal axis represents a position of each constituent element of the light-emitting element 1, and the vertical axis represents an electron energy level of each constituent element of the light-emitting element 1.

The light-emitting element 1 includes a cathode electrode 2, an anode electrode 3, and a first light-emitting layer 4 including a first quantum dot and a second light-emitting layer 5 including a second quantum dot between the cathode electrode 2 and the anode electrode 3 in order from the cathode electrode 2. The first light-emitting layer 4 and the second light-emitting layer 5 constitute a function layer 16.

An electron transportation layer (ETL) 15 is formed between the first light-emitting layer 4 and the cathode electrode 2. A hole transportation layer (HTL) 14 is formed between the second light-emitting layer 5 and the anode electrode 3. The anode electrode 3 is formed on a substrate 17. A power source 18 is provided between the anode electrode 3 and the cathode electrode 2.

The first quantum dot of the first light-emitting layer 4 has a core-shell structure including at least a first core 8 and a first shell 9. The second quantum dot of the second light-emitting layer 5 has a core-shell structure including at least a second core 11 and a second shell 12. The first shell 9 and the second shell 12 may have a multi-shell structure or a double-shell structure.

An energy level E1 at a lower end of a conduction band of the first core 8 is higher than an energy level E2 at a lower end of a conduction band of the second core 11. This suppresses an outflow of electrons indicated by an arrow A1 from the first light-emitting layer 4 to the anode electrode 3. As a result, it is possible to provide the light-emitting element 1 having an improved luminous efficiency.

An energy level E3 at an upper end of a valence band of the first core 8 is preferably higher than an energy level E4 at an upper end of a valence band of the second core 11. This suppresses an outflow of holes indicated by an arrow A2 from the second light-emitting layer 5 to the cathode electrode 2. As a result, it is possible to provide the light-emitting element 1 having further improved luminous efficiency.

Here, the energy level at the lower end of the conduction band corresponds to a lowest unoccupied molecular orbital (LUMO) level. The energy level at the upper end of the valence band corresponds to a highest occupied molecular orbital (HOMO) level.

An energy level at a lower end of a conduction band of the first shell 9 is equal to an energy level at a lower end of a conduction band of the second shell 12. An energy level at an upper end of a valence band of the first shell 9 is equal to an energy level at an upper end of a valence band of the second shell 12.

A wavelength of light from the first light-emitting layer 4 and a wavelength of light from the second light-emitting layer 5 are preferably substantially the same.

The first core 8 of the first light-emitting layer 4 preferably includes InP, and the second core 11 of the second light-emitting layer 5 preferably includes CdSe.

The first shell 9 of the first light-emitting layer 4 preferably includes ZnS, and the second shell 12 of the second light-emitting layer 5 preferably includes at least one of CdS, CdZnS, ZnSe, ZnS, and ZnSeS.

Preferably, the first shell 9 includes ZnSeS, and the second shell 12 includes at least one of CdS, CdZnS, ZnSe, and ZnSeS.

Preferably, the first shell 9 includes ZnSe, and the second shell 12 includes at least one of CdS, CdZnS, and ZnSe.

The first core 8 and the first shell 9 of the first light-emitting layer 4, and the second core 11 and the second shell 12 of the second light-emitting layer 5 may be configured of materials of, for example, (InP/ZnSe:CdSe/ZnSe) or (InP/ZnS:CdSe/ZnS) (first core 8/first shell 9:second core 11/second shell 12).

Second Embodiment

Figure 3:
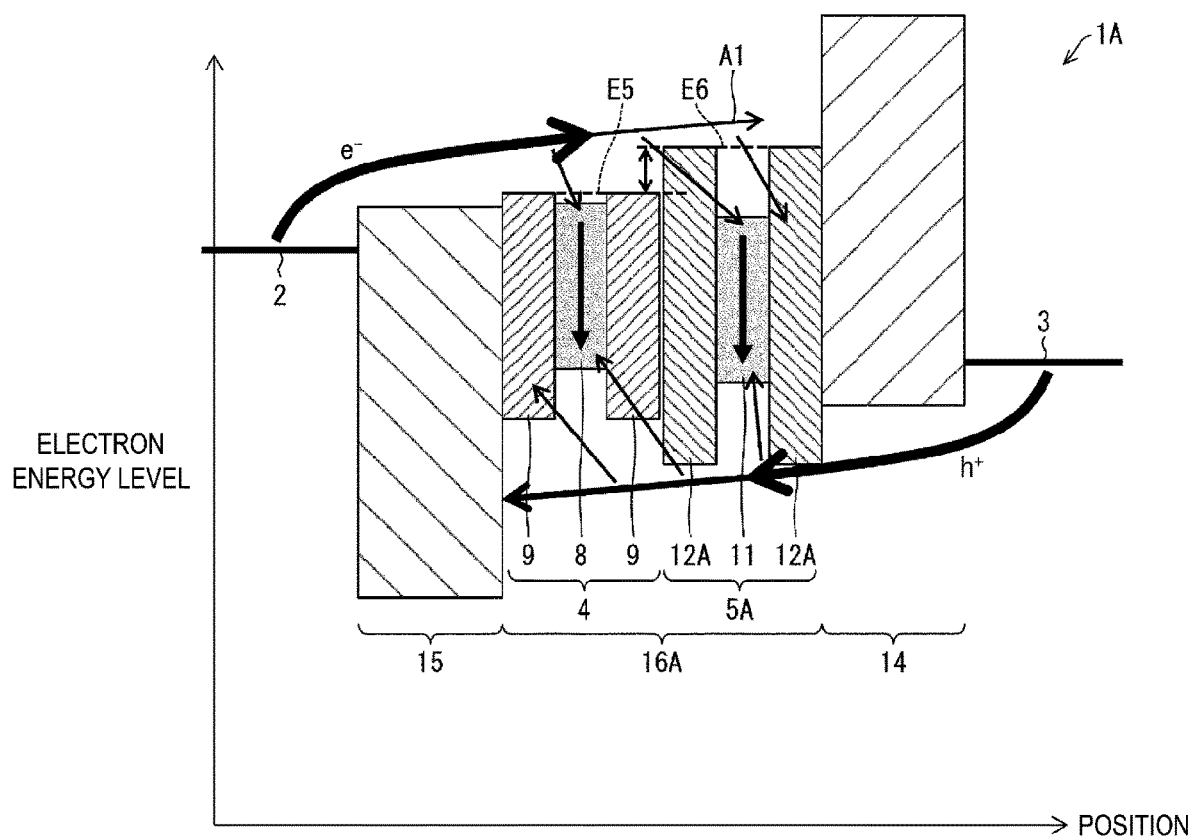
FIG. 3 is a graph for describing an energy level of a light-emitting element according to a second embodiment.

FIG. 3 is a graph for describing an energy level of a light-emitting element 1A according to a second embodiment. Constituent elements similar to the constituent elements described above are given the same reference numerals, and detailed descriptions thereof are not repeated.

The first shell 9 is the outermost shell of a first quantum dot in the first light-emitting layer 4, a second shell 12A is the outermost shell of a second quantum dot in a second light-emitting layer 5A, and an energy level E5 at a lower end of a conduction band of the first shell 9 is lower than an energy level E6 at a lower end of a conduction band of the second shell 12A. As a result, it is possible to provide the light-emitting element 1A exhibiting an effect of further effectively suppressing the outflow of electrons indicated by the arrow A1 from the first light-emitting layer 4 to the anode electrode 3 and having an improved luminous efficiency, in addition to the effect described above in the first embodiment.

In particular, generally, in a quantum dot light emitting diode (QLED), electrons from the cathode electrode 2 are likely to penetrate through the second light-emitting layer 5A toward the hole transportation layer 14, and a light-emitting region is biased toward the hole transportation layer 14 of the second light-emitting layer 5A. According to the second embodiment, penetration of electrons is suppressed, which is particularly advantageous to improve luminous efficiency.

An energy level at an upper end of a valence band of the first shell 9 is higher than an energy level at an upper end of a valence band of the second shell 12A.

The first core 8 and the first shell 9 of the first light-emitting layer 4 and the second core 11 and the second shell 12A of the second light-emitting layer 5A may be configured of materials of, for example, (InP/ZnSe:CdSe/ZnS, CdSe/CdZnS, CdSe/ZnSe) or (InP/ZnS:CdSe/ZnS) (first core 8/first shell 9:second core 11/second shell 12A).

Third Embodiment

Figure 4:
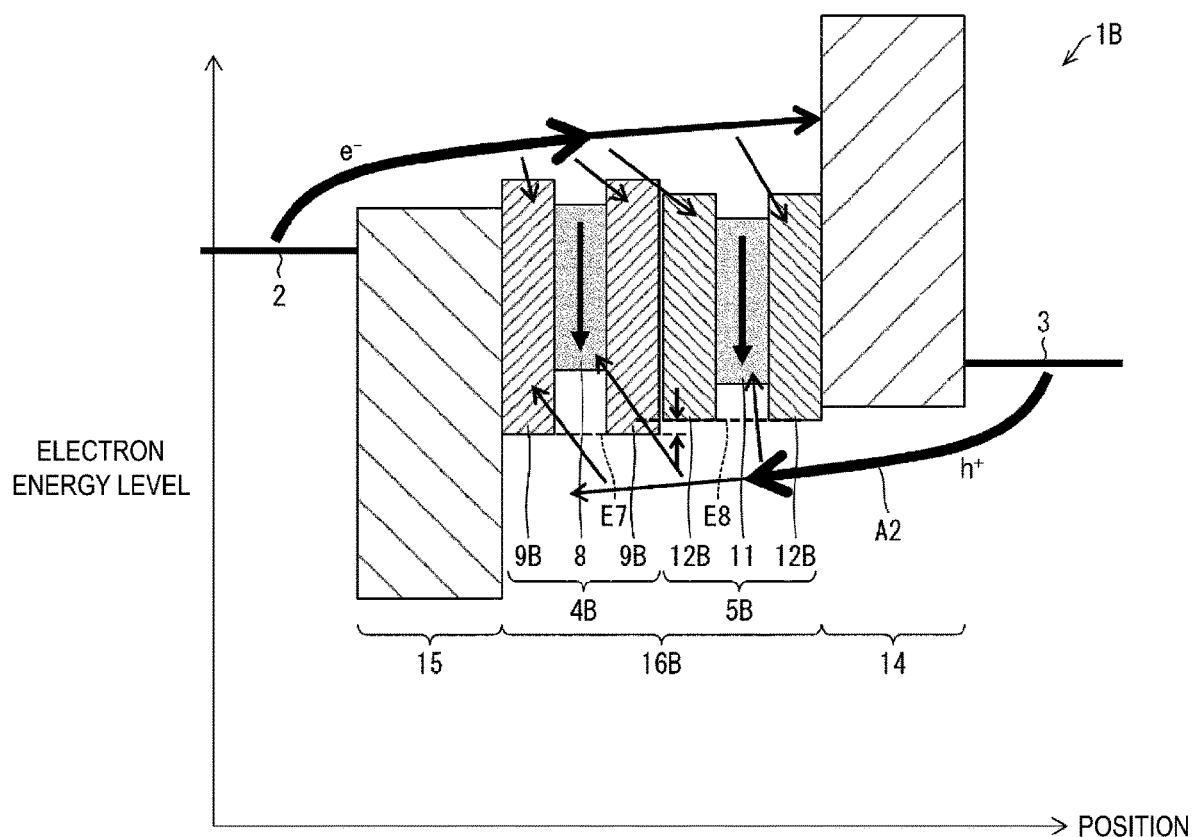
FIG. 4 is a graph for describing an energy level of a light-emitting element according to a third embodiment.

FIG. 4 is a graph for describing an energy level of a light-emitting element 1B according to a third embodiment. Constituent elements similar to the constituent elements described above are given the same reference numerals, and detailed descriptions thereof are not repeated.

An energy level E7 at an upper end of a valence band of a first shell 9B of a first light-emitting layer 4B is lower than an energy level E8 at an upper end of a valence band of a second shell 12B of a second light-emitting layer 5B. As a result, it is possible to provide the light-emitting element 1B further effectively suppressing the outflow of holes from the second light-emitting layer 5B to the cathode electrode 2 indicated by the arrow A2 and having an improved luminous efficiency.

The first core 8 and the first shell 9B of the first light-emitting layer 4B and the second core 11 and the second shell 12B of the second light-emitting layer 5B may be configured of materials of, for example, (InP/ZnS:CdSe/CdS, CdSe/CdZnS, CdSe/ZnSe, CdSe/ZnS, CdSe/ZnSeS), (InP/ZnSeS:CdSe/CdS, CdSe/CdZnS, CdSe/ZnSe, CdSe/ZnSeS), or (InP/ZnSe:CdSe/CdS, CdSe/CdZnS, CdSe/ZnSe) (first core 8/first shell 9B:second core 11/second shell 12B).

Fourth Embodiment

Figure 5:
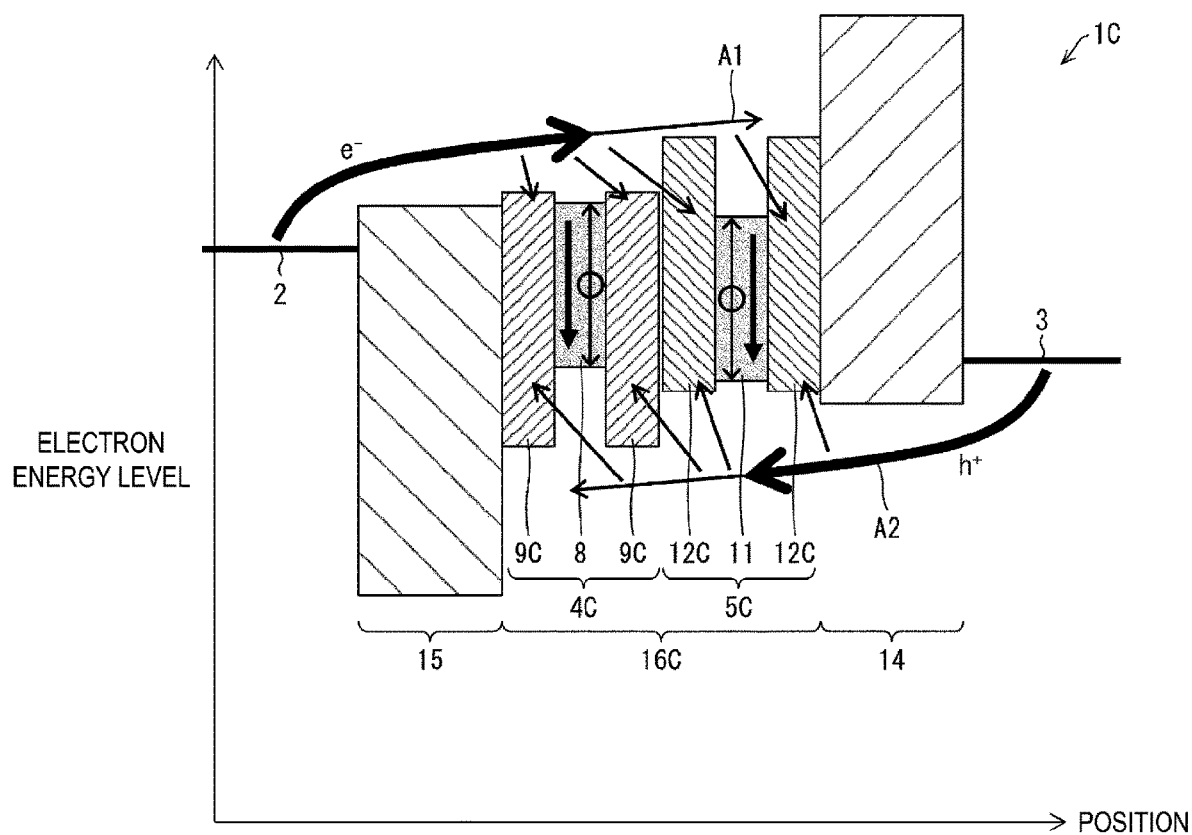
FIG. 5 is a graph for describing an energy level of a light-emitting element according to a fourth embodiment.

FIG. 5 is a graph for describing an energy level of a light-emitting element 1C according to a fourth embodiment. Constituent elements similar to the constituent elements described above are given the same reference numerals, and detailed descriptions thereof are not repeated.

In the light-emitting element 1C, both an energy level at an upper end of a valence band and an energy level at a lower end of a conduction band have the configurations of the first to third embodiments described above.

That is, an energy level at a lower end of a conduction band of a first core 8 of a first light-emitting layer 4C is higher than an energy level at a lower end of a conduction band of a second core 11 of a second light-emitting layer 5C. An energy level at an upper end of a valence band of the first core 8 is higher than an energy level at an upper end of a valence band of the second core 11. An energy level at a lower end of a conduction band of the first shell 9C of the first light-emitting layer 4C is lower than an energy level at a lower end of a conduction band of the second shell 12C of the second light-emitting layer 5C. An energy level at an upper end of a valence band of the first shell 9C is lower than an energy level at an upper end of a valence band of the second shell 12C.

A wavelength of light from the first light-emitting layer 4C and a wavelength of light from the second light-emitting layer 5C are substantially the same. An emission wavelength of the first light-emitting layer 4C is controlled by a core size of the first core 8, and an emission wavelength of the second light-emitting layer 5C is controlled by a core size of the second core 11.

The first core 8 and the first shell 9C of the first light-emitting layer 4C, and the second core 11 and the second shell 12C of the second light-emitting layer 5C may be configured of materials of, for example, (InP/CdZnS:CdSe/ZnS, CdSe/ZnSeS), or (InP/ZnSe:CdSe/ZnS) (first core 8/first shell 9C:second core 11/second shell 12C).

Fifth Embodiment

Figure 6:
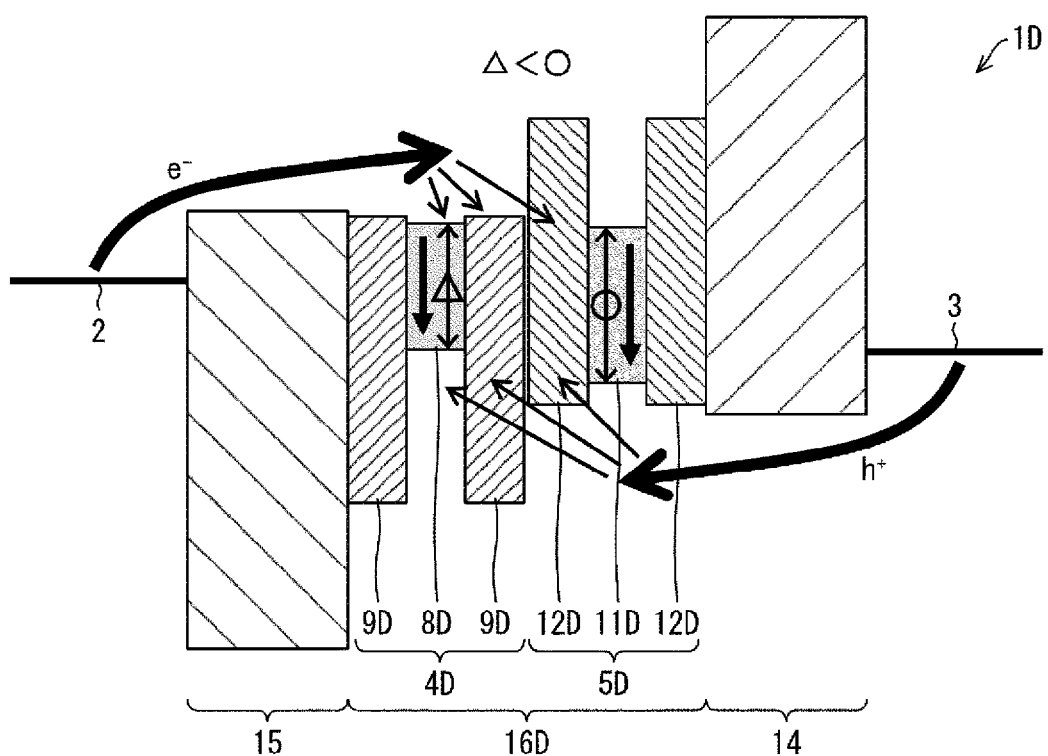
FIG. 6 is a graph for describing an energy level of a light-emitting element in a low-voltage region according to a fifth embodiment.
Figure 7:
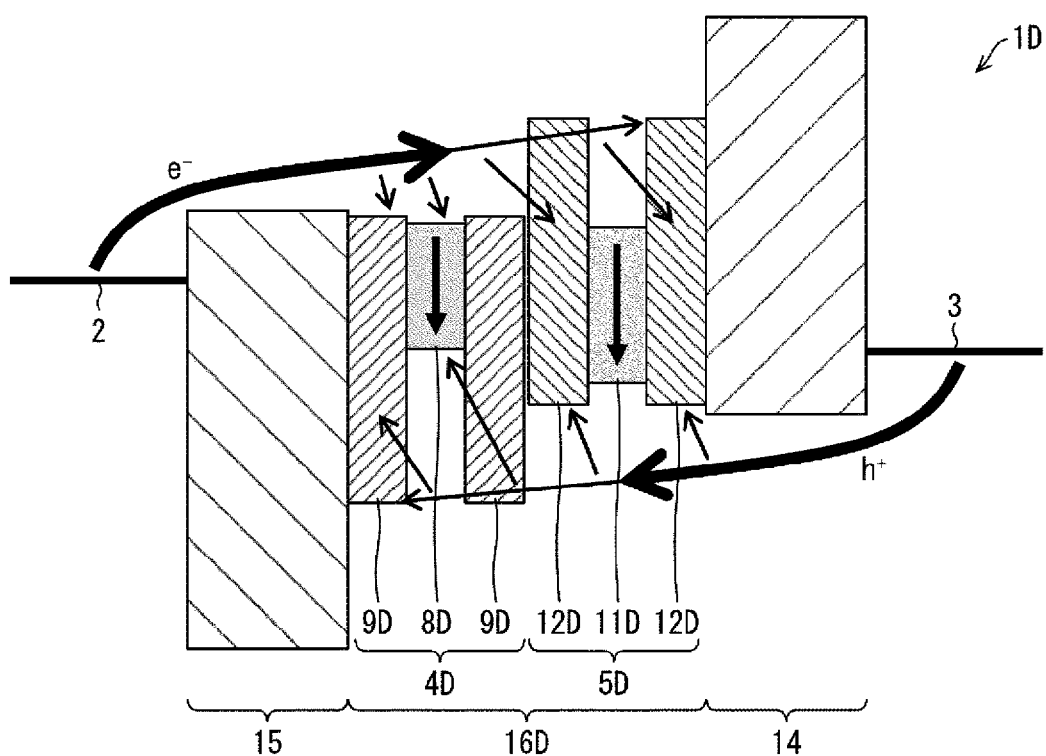
FIG. 7 is a graph for describing an energy level of the light-emitting element in a high-voltage region according to the fifth embodiment.
Figure 8:
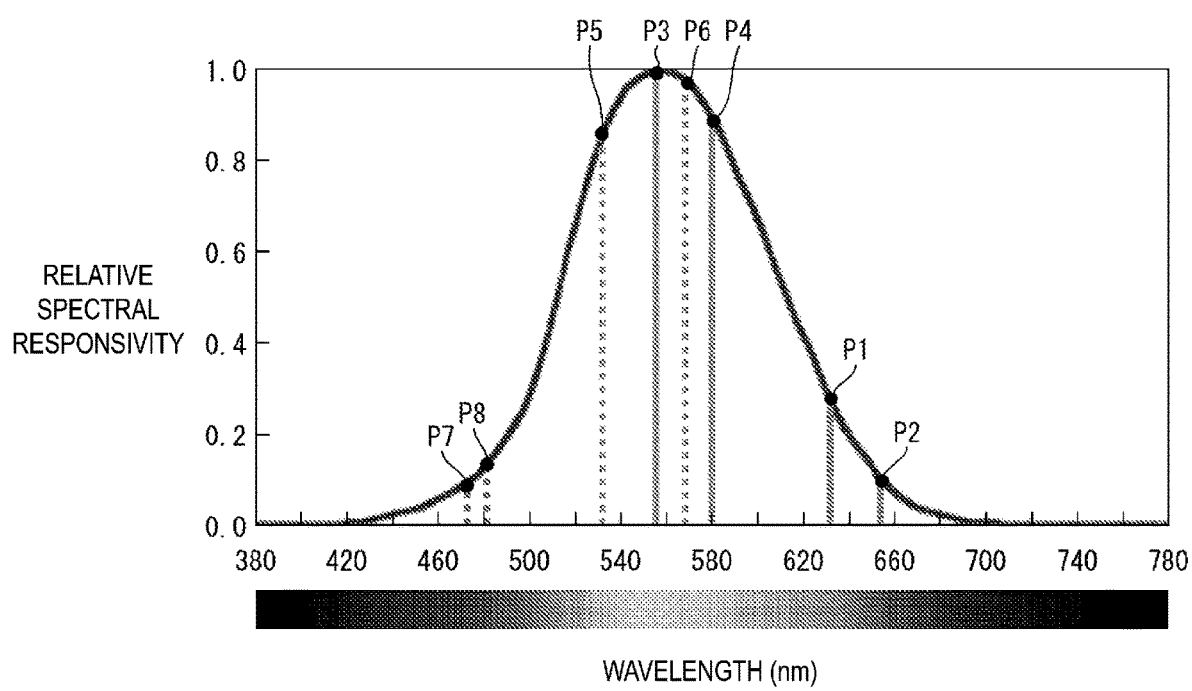
FIG. 8 is a graph showing the relationship between an emission wavelength and a relative spectral responsivity of the light-emitting element according to the fifth embodiment.

FIG. 6 is a graph for describing an energy level of a light-emitting element 1D in a low-voltage region according to a fifth embodiment. FIG. 7 is a graph for describing an energy level of the light-emitting element 1D in a high-voltage region. FIG. 8 is a graph showing the relationship between an emission wavelength and a relative spectral responsivity of the light-emitting element 1D. Constituent elements similar to the constituent elements described above are given the same reference numerals, and detailed descriptions thereof are not repeated.

A wavelength of light from a first light-emitting layer 4D is longer than a wavelength of light from a second light-emitting layer 5D. Of the light from the first light-emitting layer 4D and the light from the second light-emitting layer 5D, light having a higher luminosity factor has a shorter wavelength.

Thus, in a case where the light-emitting element 1D is a red light-emitting element that emits red light, as indicated by the points P1, P2 in FIG. 8, light having a higher luminosity factor always has a shorter wavelength. On the other hand, in a case where the light-emitting element 1D is a green light-emitting element that emits green light, when the point P3 and the point P4 correspond to the light from the first light-emitting layer 4D and the light from the second light-emitting layer 5D, respectively, light having a higher luminosity factor has a shorter wavelength, but when the point P5 and the point P6 correspond to the light from the first light-emitting layer 4D and the light from the second light-emitting layer 5D, respectively, light having a higher luminosity factor does not have a shorter wavelength. Further, in a case where the light-emitting element 1D is a blue light-emitting element that emits blue light, as indicated by the points P7, P8 in FIG. 8, light having a higher luminosity factor does not have a shorter wavelength.

In a low-luminance (low-voltage) region shown in FIG. 6, a tunnel current flowing to a first core 8D is dominant, and the first light-emitting layer 4D having a long wavelength mainly emits light. In a high-luminance (high-voltage) region shown in FIG. 7, electron movement through a first shell 9D and a second shell 12D is dominant, and the first light-emitting layer 4D having a long wavelength and the second light-emitting layer 5D having a short wavelength (high luminosity factor) uniformly emit light. Due to this, an influence of the short wavelength (high luminosity factor) is large compared to at a low voltage. Further, a luminance [cd], a current efficiency [cd/A], and an energy efficiency [lm/W] of the light-emitting element 1D are improved.

An emission wavelength of the first light-emitting layer 4D is controlled by a core size of the first core 8D, and an emission wavelength of the second light-emitting layer 5D is controlled by a core size of a second core 11D.

The second core 11D having the second quantum dots included in the second light-emitting layer 5D includes Cd, and the first core 8D having the first quantum dots included in the first light-emitting layer 4D does not include Cd. Many of the second quantum dots including Cd can exhibit a high luminance, and thus the second quantum dots including Cd of the second light-emitting layer 5D are illuminated in the high-voltage region shown in FIG. 7, thereby obtaining a high luminance. On the other hand, the second quantum dots including Cd have a safety issue. Thus, the first quantum dots of the first light-emitting layer 4D that are mainly illuminated in the low-voltage region shown in FIG. 6 do not include Cd, so that it is possible to reduce the Cd content while maintaining a high luminance.

The first core 8D and the first shell 9D of the first light-emitting layer 4D, and the second core 11D and the second shell 12D of the second light-emitting layer 5D may be configured of materials of, for example, (InP/CdZnS:CdSe/ZnS, CdSe/ZnSeS), or (InP/ZnSe:CdSe/ZnS) (first core 8D/first shell 9D:second core 11D/second shell 12D).

Figure 9:
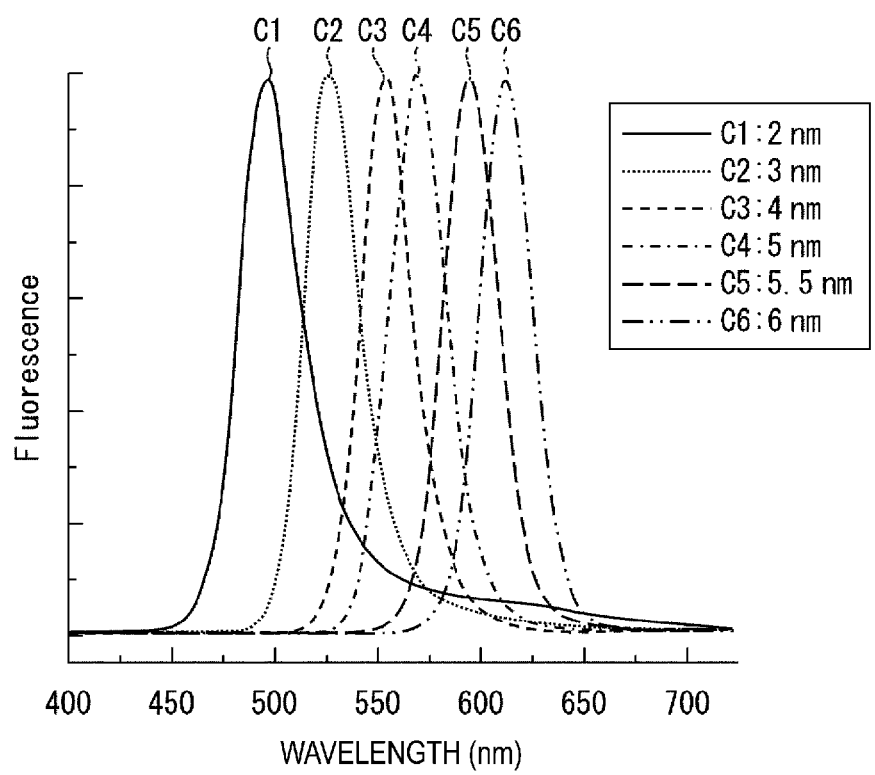
FIG. 9 is a graph showing the relationship between the emission wavelength and a fluorescence intensity of the light-emitting element according to the fifth embodiment.
Figure 10:
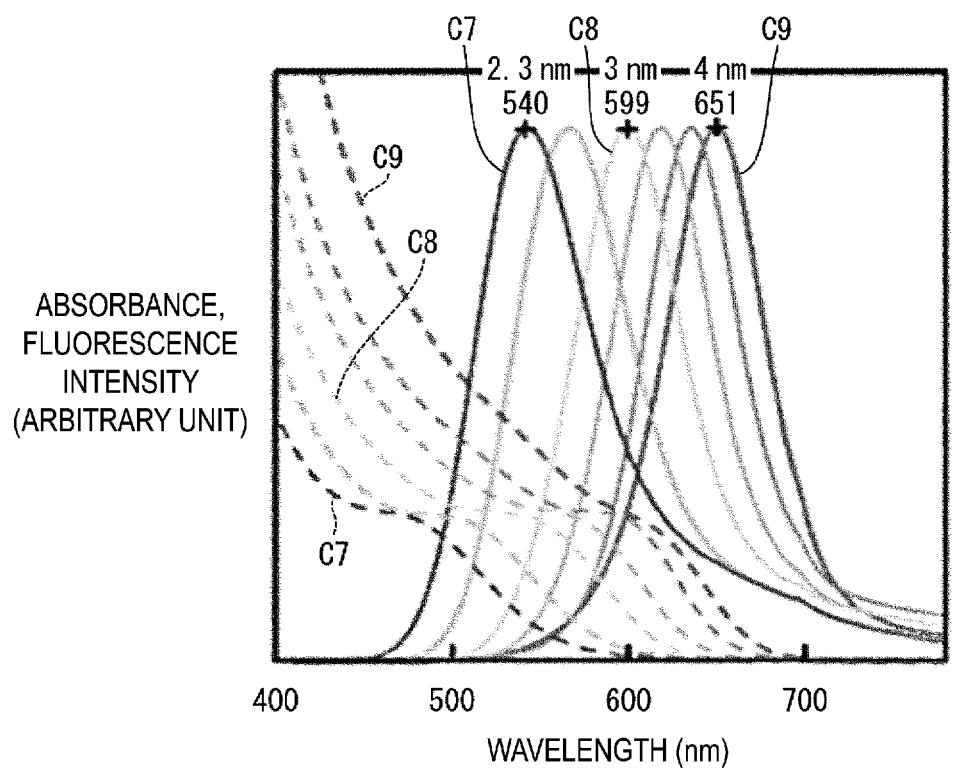
FIG. 10 is a graph showing the relationship between the emission wavelength, an absorbance, and the fluorescence intensity of the light-emitting element according to the fifth embodiment.

FIG. 9 is a graph showing the relationship between an emission wavelength and a fluorescence intensity of the light-emitting element according to the fifth embodiment. FIG. 10 is a graph showing the relationship between the emission wavelength, an absorbance, and the fluorescence intensity of the light-emitting element according to the fifth embodiment.

With reference to FIG. 9, a curve C1 represents the relationship between an emission wavelength and a fluorescence intensity of CdSe included in the second core 11D of the second light-emitting layer 5D and having a core size of 2 nm, and a curve C2 represents the relationship between an emission wavelength and a fluorescence intensity of CdSe having a core size of 3 nm. A curve C3 represents the relationship between an emission wavelength and a fluorescence intensity of CdSe having a core size of 4 nm, a curve C4 represents the relationship between an emission wavelength and a fluorescence intensity of CdSe having a core size of 5 nm, and a curve C5 represents the relationship between an emission wavelength and a fluorescence intensity of CdSe having a core size of 5.5 nm. A curve C6 represents the relationship between an emission wavelength and a fluorescence intensity of CdSe having a core size of 6 nm.

With reference to FIG. 10, a dashed curve C7 represents the relationship between an emission wavelength and an absorbance of InP included in the first core 8D of the first light-emitting layer 4D and having a core size of 2.3 nm, and a solid curve C7 represents the relationship between the emission wavelength and a fluorescence intensity. A dashed curve C8 represents the relationship between an emission wavelength and an absorbance of InP having a core size of 3.3 nm, and a solid curve C8 represents the relationship between the emission wavelength and a fluorescence intensity. A dashed curve C9 represents the relationship between an emission wavelength and an absorbance of InP having a core size of 4 nm, and a solid curve C9 represents the relationship between the emission wavelength and a fluorescence intensity.

Examples of a combination of core diameters include a combination of light-emitting layers of CdSe having a core size of 4 nm and InP having a core size of 2.3 nm of a green light-emitting element, a combination of light-emitting layers of CdSe having a core size of 6 nm and InP having a core size of 3.3 nm of a red light-emitting element, and a combination of light-emitting layers of CdSe having a core size of 6 nm and InP having a core size of 4 nm of a red light-emitting element.

A shell thickness of the second shell 12D around the second core 11D including CdSe is, for example, 0.5 nm. A shell thickness of the first shell 9D around the first core 8D including InP is, for example, 1.5 nm.

Figure 11:
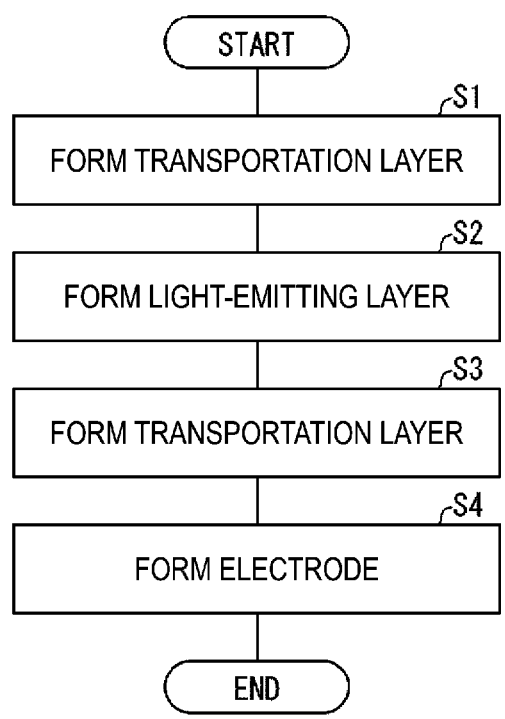
FIG. 11 is a flowchart illustrating a manufacturing method of a light-emitting element according to an embodiment.

FIG. 11 is a flowchart illustrating an example of a manufacturing method of a light-emitting element according to an embodiment. First, the hole transportation layer 14 is formed on the anode electrode 3 on the substrate 17 by, for example, vapor deposition or ink-jetting (step S1). Then, the second light-emitting layer 5 and the first light-emitting layer 4 are formed in this order on the hole transportation layer 14 by, for example, ink-jetting (step S2). Next, the electron transportation layer 15 is formed on the first light-emitting layer 4 by, for example, vapor deposition or ink-jetting (step S3). Thereafter, the cathode electrode 2 is formed on the electron transportation layer 15 by, for example, vapor deposition (step S4).

In this manner, the anode electrode 3, the hole transportation layer 14, the second light-emitting layer 5, the first light-emitting layer 4, the electron transportation layer 15, and the cathode electrode 2 may be formed in this order or may be formed in a reverse order thereof.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

Reference Signs List

The invention claimed is:

1. A light-emitting element comprising:
a cathode electrode;
an anode electrode; and
a first light-emitting layer including a first quantum dot and a second light-emitting layer including a second quantum dot provided between the cathode electrode and the anode electrode in this order from the cathode electrode,
wherein the first quantum dot has a core-shell structure including at least a first core and a first shell, and the second quantum dot has a core-shell structure including at least a second core and a second shell,
a level at a lower end of a conduction band of the first core is higher than a level at a lower end of a conduction band of the second core, and
the first light-emitting layer and the second light-emitting layer are in direct contact with each other.

2. The light-emitting element according to claim 1,
wherein a level at an upper end of a valence band of the first core is higher than a level at an upper end of a valence band of the second core.

3. The light-emitting element according to claim 1,
wherein the first shell is an outermost shell of the first quantum dot, and the second shell is an outermost shell of the second quantum dot, and
a level at a lower end of a conduction band of the first shell is lower than a level at a lower end of a conduction band of the second shell.

4. The light-emitting element according to claim 3,
wherein a level at an upper end of a valence band of the first shell is lower than a level at an upper end of a valence band of the second shell.

5. The light-emitting element according to claim 1,
wherein a wavelength of light from the first light-emitting layer and a wavelength of light from the second light-emitting layer are substantially identical.

6. The light-emitting element according to claim 1,
wherein a wavelength of light from the first light-emitting layer is longer than a wavelength of light from the second light-emitting layer.

7. The light-emitting element according to claim 6,
wherein a plurality of light-emitting elements, including the light-emitting element, is provided, and the plurality of light-emitting elements includes at least a blue light-emitting element configured to emit blue light, a green light-emitting element configured to emit green light, and a red light-emitting element configured to emit red light, and
in the red light-emitting element, the wavelength of the light from the first light-emitting layer is longer than the wavelength of the light from the second light-emitting layer.

8. The light-emitting element according to claim 6,
wherein a plurality of light-emitting elements, including the light-emitting element, is provided, and the plurality of light-emitting elements includes at least a blue light-emitting element configured to emit blue light, a green light-emitting element configured to emit green light, and a red light-emitting element configured to emit red light, and
in the green light-emitting element, the wavelength of the light from the first light-emitting layer is longer than the wavelength of the light from the second light-emitting layer.

9. The light-emitting element according to claim 6,
wherein a plurality of light-emitting elements, including the light-emitting element, is provided, and the plurality of light-emitting elements includes at least a blue light-emitting element configured to emit blue light, a green light-emitting element configured to emit green light, and a red light-emitting element configured to emit red light, and
in the blue light-emitting element, the wavelength of the light from the first light-emitting layer is longer than the wavelength of the light from the second light-emitting layer.

10. The light-emitting element according to claim 6,
wherein the second core of the second quantum dot included in the second light-emitting layer includes Cd, and the first core of the first quantum dot included in the first light-emitting layer is free of Cd.

11. The light-emitting element according to claim 1,
wherein the first core includes InP, and the second core includes CdSe.

12. The light-emitting element according to claim 11,
wherein the first shell includes ZnS, and the second shell includes at least one of CdS, CdZnS, ZnSe, ZnS, and ZnSeS.

13. The light-emitting element according to claim 11,
wherein the first shell includes ZnSeS, and the second shell includes at least one of CdS, CdZnS, ZnSe, and ZnSeS.

14. The light-emitting element according to claim 11,
wherein the first shell includes ZnSe, and the second shell includes at least one of CdS, CdZnS, and ZnSe.

15. A light-emitting device comprising:
the light-emitting element according to claim 1.

16. The light-emitting element according to claim 1,
wherein the first light-emitting layer and the second light-emitting layer are in contact with each other.

17. The light-emitting element according to claim 1,
wherein an outflow of electrons from the first light-emitting layer to the anode electrode is suppressed.

18. The light-emitting element according to claim 1, wherein the first light-emitting layer and the second light-emitting layer form a function layer.

19. The light-emitting element according to claim 1, wherein an entirety of one main surface of the first light-emitting layer and an entirety of one main surface of the second light-emitting layer are in direct contact with each other.

20. The light-emitting element according to claim 1, wherein the first light-emitting layer and the second light-emitting layer suppress an outflow of electrons from the first light-emitting layer to the anode electrode by being in direct contact with each other.

* * * * *